US012262641B2

(12) United States Patent
Hong et al.

(10) Patent No.: US 12,262,641 B2
(45) Date of Patent: Mar. 25, 2025

(54) MAGNETIC MEMORY DEVICE AND METHOD OF FABRICATING THE SAME

(71) Applicant: Samsung Electronics Co., Ltd., Suwon-si (KR)

(72) Inventors: Kyungil Hong, Suwon-si (KR); Jungmin Lee, Gwangmyeong-si (KR); Younghyun Kim, Seoul (KR); Junghwan Park, Seoul (KR); Heeju Shin, Seoul (KR); Se Chung Oh, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 377 days.

(21) Appl. No.: 17/466,246

(22) Filed: Sep. 3, 2021

(65) Prior Publication Data

US 2022/0254994 A1    Aug. 11, 2022

(30) Foreign Application Priority Data

Feb. 5, 2021  (KR) .......................... 10-2021-0016971

(51) Int. Cl.
| | |
|---|---|
| *H10N 50/10* | (2023.01) |
| *G11C 11/16* | (2006.01) |
| *H10B 61/00* | (2023.01) |
| *H10N 50/01* | (2023.01) |
| *H10N 50/80* | (2023.01) |
| *H10N 50/85* | (2023.01) |

(52) U.S. Cl.
CPC ........... *H10N 50/01* (2023.02); *G11C 11/161* (2013.01); *H10B 61/00* (2023.02); *H10N 50/10* (2023.02); *H10N 50/80* (2023.02); *H10N 50/85* (2023.02)

(58) Field of Classification Search
CPC ........ H10N 50/01; H10N 50/10; H10N 50/85; G11C 11/161; H10B 61/00
See application file for complete search history.

(56) References Cited

U.S. PATENT DOCUMENTS

| 8,809,976 B2 | 8/2014 | Chen et al. |
|---|---|---|
| 9,515,250 B2 | 12/2016 | Ha |
| 9,905,282 B1 * | 2/2018 | Yi .......................... H01F 41/303 |
| 9,935,261 B1 | 4/2018 | Patel et al. |

(Continued)

FOREIGN PATENT DOCUMENTS

CN       109994600 A    7/2019

*Primary Examiner* — Eugene Lee
(74) *Attorney, Agent, or Firm* — Harness, Dickey & Pierce, P.L.C.

(57) ABSTRACT

A method of fabricating a magnetic memory device comprises forming, on a substrate, a data storage structure including a bottom electrode, a magnetic tunnel junction pattern, and a top electrode, forming a first capping dielectric layer conformally covering lateral and top surfaces of the data storage structure, and forming a second capping dielectric layer on the first capping dielectric layer. The forming the first capping dielectric layer is performed by PECVD in which a first source gas, a first reaction gas, and a first purging gas are supplied. The forming the second capping dielectric layer Is performed by PECVD in which a second source gas, a second reaction gas, and a second purging gas are supplied. The first and second reaction gases are different from each other. The first and second purging gases are different from each other.

15 Claims, 10 Drawing Sheets

(56) References Cited

U.S. PATENT DOCUMENTS

| | | | |
|---|---|---|---|
| 10,026,890 B2 | 7/2018 | Kim et al. | |
| 10,468,595 B2 | 11/2019 | Omstead et al. | |
| 10,522,738 B2 | 12/2019 | Ha | |
| 10,553,410 B2 | 2/2020 | Saito et al. | |
| 10,693,063 B2 | 6/2020 | Hansen et al. | |
| 2008/0206895 A1* | 8/2008 | Asao | H10N 50/10 |
| | | | 257/E27.005 |
| 2013/0032908 A1* | 2/2013 | Tang | H10N 50/10 |
| | | | 257/E29.323 |
| 2015/0263272 A1* | 9/2015 | Tomioka | H10N 50/10 |
| | | | 156/345.31 |
| 2017/0117454 A1* | 4/2017 | Yoshikawa | H10N 50/01 |
| 2018/0197915 A1* | 7/2018 | Briggs | H10N 50/80 |
| 2018/0277750 A1* | 9/2018 | Kim | G11C 11/161 |
| 2019/0148633 A1* | 5/2019 | Dai | H10N 50/01 |
| | | | 257/421 |
| 2019/0165260 A1* | 5/2019 | Yu | H01F 41/308 |
| 2019/0245139 A1 | 8/2019 | Chuang et al. | |
| 2020/0035912 A1 | 1/2020 | Iwata et al. | |
| 2020/0066987 A1 | 2/2020 | Sims et al. | |
| 2020/0111957 A1 | 4/2020 | Kim et al. | |
| 2020/0152865 A1 | 5/2020 | Lin et al. | |
| 2021/0143324 A1* | 5/2021 | Lin | H10N 50/10 |
| 2022/0406996 A1* | 12/2022 | Kuo | H10N 50/01 |

* cited by examiner

MAGNETIC MEMORY DEVICE AND METHOD OF FABRICATING THE SAME

CROSS-REFERENCE TO RELATED APPLICATION

This U.S. nonprovisional application claims priority under 35 U.S.C § 119 to Korean Patent Application No. 10-2021-0016971 filed on Feb. 5, 2021 in the Korean Intellectual Property Office, the disclosure of which is hereby incorporated by reference in its entirety.

BACKGROUND

The present inventive concepts relate to semiconductor devices and methods of fabricating the same, and more particularly to, magnetic memory devices and methods of fabricating the same.

As electronic products trend toward high speed and/or low power consumption, high speed and low operating voltages are increasingly required for semiconductor memory devices incorporated in the electronic products. In order to meet the requirements above, magnetic memory devices have been developed as semiconductor memory devices. Because magnetic memory devices operate at high speeds and have nonvolatile characteristics, they have attracted considerable attention as the next-generation semiconductor memory devices.

In general, the magnetic memory device may include a magnetic tunnel junction (MTJ) pattern. The magnetic tunnel junction pattern includes two magnetic structures and an insulation layer interposed therebetween. The resistance of the magnetic tunnel junction pattern varies depending on magnetization directions of the two magnetic structures. For example, the magnetic tunnel junction pattern has high resistance when the magnetization directions of the two magnetic structures are antiparallel and low resistance when the magnetization directions of the two magnetic structures are parallel. The magnetic memory device may write and read data using the resistance difference between the high and low resistances of the magnetic tunnel junction.

With the remarkable advance in electronic industry, there is an increasing demand for high integration and/or low power consumption of magnetic memory devices. Accordingly, many studies have been conducted to meet these demands.

SUMMARY

Some example embodiments of the present inventive concepts provide a magnetic memory device whose defects are minimized and a method of fabricating the same.

Some example embodiments of the present inventive concepts provide a magnetic memory device whose production yield is increased and a method of fabricating the same.

The object of the present inventive concepts is not limited to the example embodiments mentioned above, and other objects which have not been mentioned above will be clearly understood to those skilled in the art from the following description.

According to some example embodiments of the present inventive concepts, a method of fabricating a magnetic memory device may comprise: forming a data storage structure on a substrate, wherein forming the data storage structure includes sequentially forming a bottom electrode, a magnetic tunnel junction pattern, and a top electrode on the substrate; forming a first capping dielectric layer that conformally covers a lateral surface and a top surface of the data storage structure; and forming a second capping dielectric layer on the first capping dielectric layer. The step of forming the first capping dielectric layer may be performed based on a plasma-enhanced chemical vapor deposition (PECVD) process in which a first source gas, a first reaction gas, and a first purging gas are supplied into a first chamber in which the data storage structure and the substrate are located. The step of forming the second capping dielectric layer may be performed based on a plasma-enhanced chemical vapor deposition (PECVD) process in which a second source gas, a second reaction gas, and a second purging gas are supplied into a second chamber in which the first capping dielectric layer, the data storage structure and the substrate are located. The first and second reaction gases may be different from each other. The first and second purging gases may be different from each other.

According to some example embodiments of the present inventive concepts, a method of fabricating a magnetic memory device may comprise: forming a data storage structure on a substrate, wherein forming the data storage structure includes sequentially forming a bottom electrode, a magnetic tunnel junction pattern, and a top electrode on the substrate; forming a first capping dielectric layer that conformally covers a lateral surface and a top surface of the data storage structure; and forming a second capping dielectric layer on the first capping dielectric layer. Each of the first and second capping dielectric layers may include silicon nitride. The step of forming the first capping dielectric layer and the step of forming the second capping dielectric layer may be performed by different methods from each other. The step of forming the first capping dielectric layer may be performed under a temperature of about 275° C. to about 325° C. The step of forming the second capping dielectric layer may be performed under a temperature of about 350° C. to about 400° C.

According to some example embodiments of the present inventive concepts, a magnetic memory device may comprise: a lower interlayer dielectric layer on a substrate; a lower electrode contact in the lower interlayer dielectric layer; a magnetic tunnel junction pattern on the lower electrode contact; and a first capping dielectric layer and a second capping dielectric layer that are sequentially stacked on a lateral surface of the magnetic tunnel junction pattern. The lower interlayer dielectric layer may have a recession that is recessed toward the substrate on opposite sides of the magnetic tunnel junction pattern. The first capping dielectric layer may extend onto an inner surface of the recession of the lower interlayer dielectric layer and may conformally cover an inner sidewall and a bottom surface of the recession. The second capping dielectric layer may fill a portion of the recession of the lower interlayer dielectric layer and may extend onto a top surface of the first capping dielectric layer.

DETAILED DESCRIPTION

Figure 1:
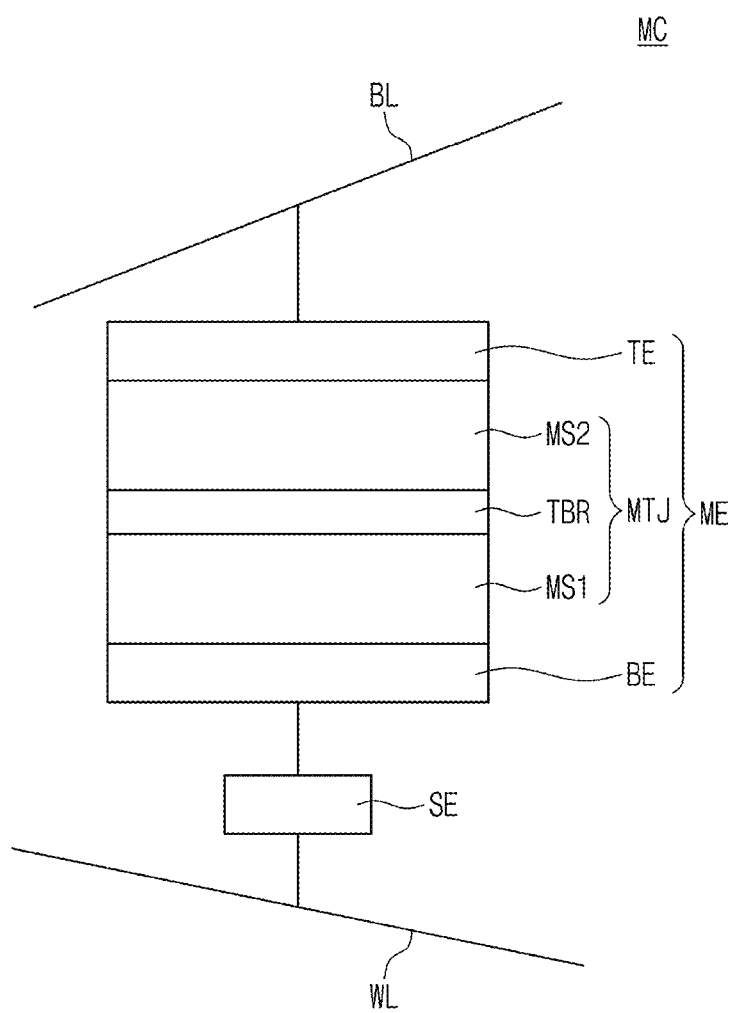
FIG. 1 illustrates a circuit diagram showing a unit memory cell of a magnetic memory device according to some example embodiments of the present inventive concepts.

The following will now describe in detail some example embodiments of the present inventive concepts with reference to the accompanying drawings.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%)).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%)).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%)).

It will be understood that elements and/or properties thereof may be recited herein as being "the same" or "equal" as other elements, and it will be further understood that elements and/or properties thereof recited herein as being "the same" as or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances. Elements and/or properties thereof that are the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIG. 1 illustrates a circuit diagram showing a unit memory cell of a magnetic memory device according to some example embodiments of the present inventive concepts.

Referring to FIG. 1, a unit memory cell MC may include a memory element ME and a select element SE. The memory element ME may be connected between a bit line BL and the select element SE, and the select element SE may be connected between the memory element ME and a word line WL. The memory element ME may be a variable resistance device that is switched from one to the other of its two resistance states by an applied electrical pulse. The memory element ME may have its electrical resistance that is changed by a spin transferring phenomenon of an electric current passing through the memory element ME. The memory element ME may have a thin-film structure configured to exhibit magneto-resistance properties and may include at least one ferromagnetic material and/or at least one anti-ferromagnetic material. The select element SE may be configured to selectively control a charge flow passing across the memory element ME. For example, the select element SE may be one of a diode, a PNP bipolar transistor, an NPN bipolar transistor, an NMOS field effect transistor, and a PMOS field effect transistor. When the select element SE is configured as a three-terminal device such as a bipolar transistor or a MOS field effect transistor, an additional connection line (not shown) may be connected to the select element SE.

The memory element ME may include a magnetic tunnel junction pattern MTJ. The magnetic tunnel junction pattern MTJ may include a first magnetic structure MS1, a second magnetic structure MS2, and a tunnel barrier pattern TBR between the first and second magnetic structures MS1 and MS2. Each of the first and second magnetic structures MS1 and MS2 may include at least one magnetic layer formed of a magnetic material. The memory element ME may further include a bottom electrode BE between the magnetic tunnel junction pattern MTJ and the select element SE and a top electrode TE between the magnetic tunnel junction pattern MTJ and the bit line BL.

Figure 2:
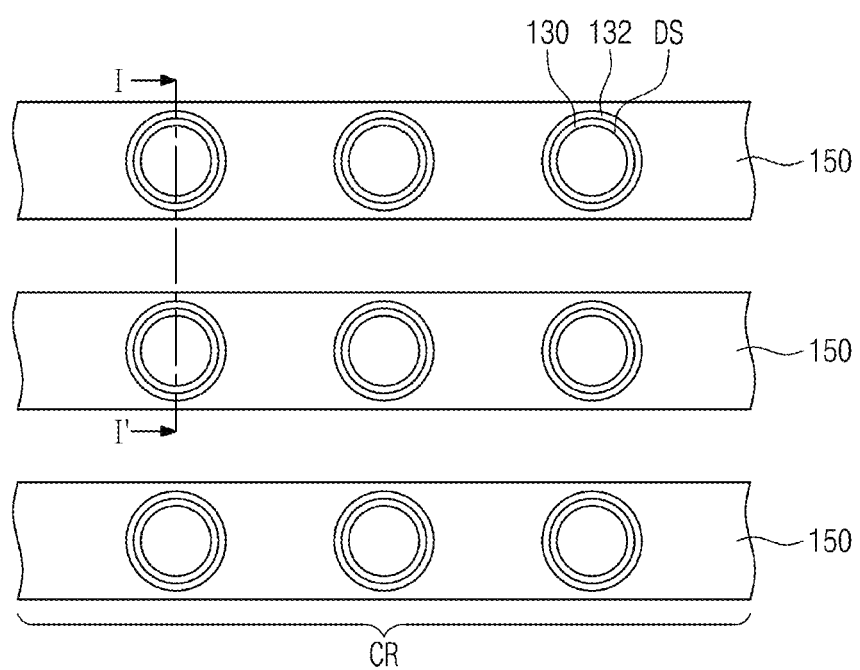
FIG. 2 illustrates a plan view showing a magnetic memory device according to some example embodiments of the present inventive concepts.
Figure 3:
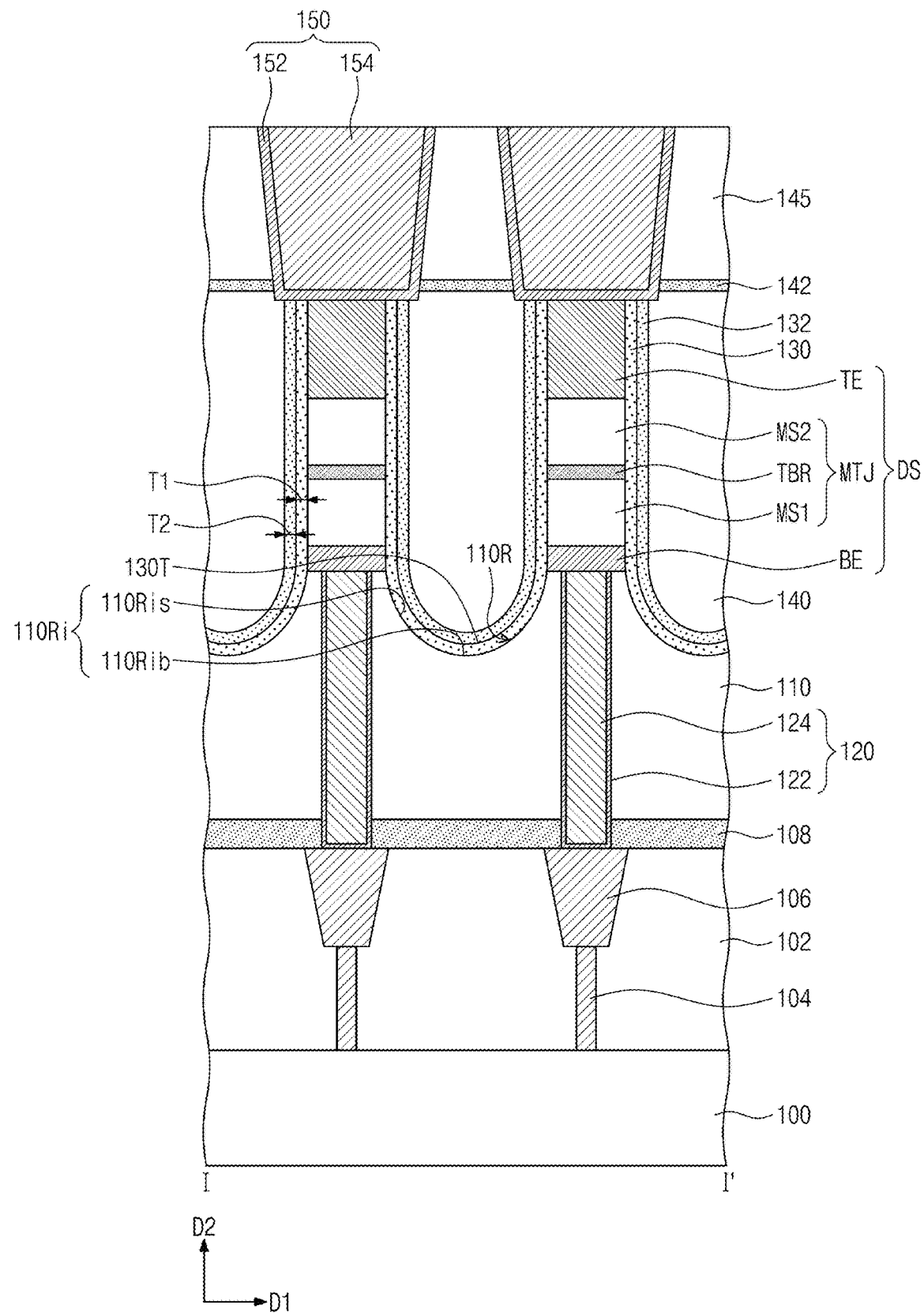
FIG. 3 illustrates a cross-sectional view taken along line I-I' of FIG. 2.

FIG. 2 illustrates a plan view showing a magnetic memory device according to some example embodiments of the present inventive concepts. FIG. 3 illustrates a cross-sectional view taken along line I-I' of FIG. 2.

Referring to FIGS. 2 and 3, a substrate 100 may be provided. The substrate 100 may include a cell region CR on which memory cells are provided. For example, the substrate 100 may be a semiconductor substrate including at least one selected from silicon, silicon-on-insulator (SOI), silicon-germanium (SiGe), germanium (Ge), and gallium-arsenic (GaAs).

Lower contacts 104 and lower lines 106 may be disposed on the substrate 100. The lower contacts 104 may be placed between the substrate 100 and the lower lines 106. Each of the lower lines 106 may be electrically connected to the substrate 100 through a corresponding one of the lower contacts 104. The lower contacts 104 and the lower lines 106 may include a conductive metallic material, such as copper (Cu). In this description, the phrase "two components are electrically connected/coupled to each other" may include the meaning "the two components are directly connected to each other or indirectly connected to each other through other conductive component."

Select elements (not shown) may be disposed in the substrate 100. The select elements may be, for example, field effect transistors. Each of the lower lines 106 may be electrically connected through a corresponding one of the lower contacts 104 to one terminal of a corresponding one of the select elements.

The substrate 100 may be provided thereon with a first interlayer dielectric layer 102 that covers the cell region CR and also covers the lower contacts 104 and the lower lines 106. The lower lines 106 may have their top surfaces substantially coplanar with that of the first interlayer dielectric layer 102. For example, the top surfaces of the lower lines 106 may be located at the same level as that of the top surface of the first interlayer dielectric layer 102. In this description, the term "level" may mean a height from a top surface of the substrate 100. The first interlayer dielectric layer 102 may include, for example, at least one selected from oxide, nitride, and oxynitride.

A lower dielectric layer 108 may be disposed on the lower lines 106 and the first interlayer dielectric layer 102 and thus may be understood to be on the substrate 100. The lower dielectric layer 108 may cover the top surfaces of the lower lines 106 and the top surface of the first interlayer dielectric layer 102. The lower dielectric layer 108 may include a different material from that of the first interlayer dielectric layer 102 and that of a second interlayer dielectric layer 110 which will be discussed below. The lower dielectric layer 108 may include a material having an etch selectivity with respect to the first and second interlayer dielectric layers 102 and 110. The lower dielectric layer 108 may include nitride, such as at least one selected from silicon nitride and silicon carbon nitride.

A second interlayer dielectric layer 110 may be disposed on the lower dielectric layer 108. The second interlayer dielectric layer 110 may include, for example, one or more of oxide, nitride, oxynitride, silicon nitride, silicon oxide, and silicon oxynitride.

A lower electrode contact 120 may be disposed on the substrate 100. The lower electrode contact 120 may be placed on the cell region CR of the substrate 100. The lower electrode contact 120 may be provided in plural, and the plurality of lower electrode contacts 120 may be disposed spaced apart from each other in a first direction D1 parallel to the top surface of the substrate 100. The lower electrode contacts 120 may be disposed in the lower dielectric layer 108 and the second interlayer dielectric layer 110. Each of the lower electrode contacts 120 may penetrate the lower dielectric layer 108 and the second interlayer dielectric layer 110, and may have connection with a corresponding one of the lower lines 106. As shown, the lower electrode contacts 120 may be understood to be on the first interlayer dielectric layer 102.

The lower electrode contact 120 may include a lower electrode pattern 124 and a lower barrier pattern 122. The lower electrode pattern 124 may be disposed in the lower dielectric layer 108 and the second interlayer dielectric layer 110. The lower barrier pattern 122 may be interposed between the second interlayer dielectric layer 110 and a lateral surface of the lower electrode pattern 124 and between the lower dielectric layer 108 and the lateral surface of the lower electrode pattern 124, and may extend between a bottom surface of the lower electrode pattern 124 and a corresponding one of the lower lines 106.

The lower electrode pattern 124 may include at least one selected from doped semiconductor materials (e.g., doped silicon), metals (e.g., tungsten, titanium, tantalum, cobalt, molybdenum, and/or ruthenium), and metal-semiconductor compounds (e.g., metal silicide). The lower barrier pattern 122 may include conductive metal nitride (e.g., titanium nitride, tantalum nitride, and/or tungsten nitride).

A data storage structure DS may be disposed on the cell region CR of the substrate 100. The data storage structure DS may be provided in plural, and the plurality of data storage structures DS may be spaced apart from each other in the first direction D1. The plurality of data storage structures DS may be correspondingly disposed on and connected to the plurality of lower electrode contacts 120.

The data storage structure DS may include a bottom electrode BE, a magnetic tunnel junction pattern MTJ, and a top electrode TE that are sequentially stacked on the lower electrode contact 120. The bottom electrode BE may be disposed between the lower electrode contact 120 and the magnetic tunnel junction pattern MTJ, and the magnetic tunnel junction pattern MTJ may be disposed between the bottom electrode BE and the top electrode TE. The magnetic tunnel junction pattern MTJ, which may be understood to be on the lower electrode contact 120, may include a first magnetic structure MS1, a second magnetic structure MS2, and a tunnel barrier pattern TBR between the first and second magnetic structures MS1 and MS2. The first magnetic structure MS1 may be disposed between the bottom electrode BE and the tunnel barrier pattern TBR, and the second magnetic structure MS2 may be disposed between the top electrode TE and the tunnel barrier pattern TBR. The bottom electrode BE may include, for example, conductive metal nitride (e.g., titanium nitride and/or tantalum nitride). The top electrode TE may include at least one selected from metal (e.g., Ta, W, Ru, and/or Ir) and conductive metal nitride (e.g., TiN).

The lower electrode contact 120 may have a bottom surface in contact with a corresponding lower line 106, and may have a top surface in contact with a bottom surface of the bottom electrode BE of the data storage structure DS. The bottom surface of the bottom electrode BE may be in contact with the top surface of the lower electrode contact 120.

Figure 4A:
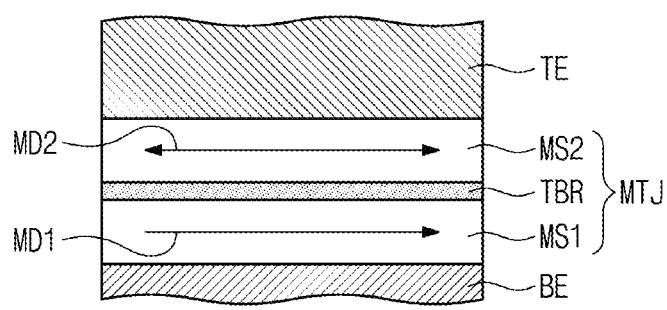
FIGS. 4A and 4B illustrate cross-sectional views showing examples of a magnetic tunnel junction pattern according to some example embodiments of the present inventive concepts.
Figure 4B:
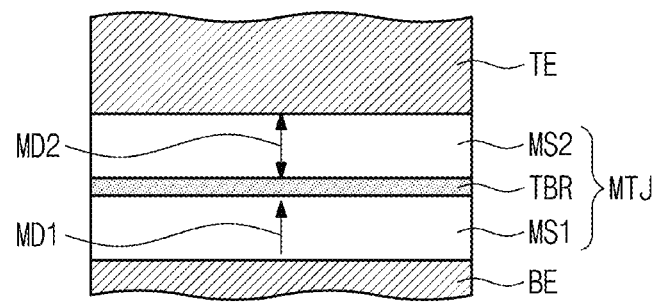

FIGS. 4A and 4B illustrate cross-sectional views showing examples of a magnetic tunnel junction pattern according to some example embodiments of the present inventive concepts.

Referring to FIGS. 4A and 4B, the first magnetic structure MS1 may include a reference layer having a magnetization direction MD1 that is unidirectionally fixed, and the second magnetic structure MS2 may include a free layer having a magnetization direction MD2 that can be changed to be parallel or antiparallel to the magnetization direction MD1 of the first magnetic structure MS1. FIGS. 4A and 4B show an example in which the second magnetic structure MS2 includes a free layer, but the present inventive concepts are not necessarily limited thereto. Differently from those shown in FIGS. 4A and 4B, the first magnetic structure MS1 may include a free layer, and the second magnetic structure MS2 may include a reference layer. Referring to FIG. 4A, as an example, the magnetization directions MD1 and MD2 of the first and second magnetic structures MS1 and MS2 may be parallel to an interface between the tunnel barrier pattern TBR and the second magnetic structure MS2. In this case, each of the first and second magnetic structures MS1 and MS2 may include a ferromagnetic material. The first magnetic structure MS1 may further include an antiferromagnetic material for fixing a magnetization direction of the ferromagnetic material in the first magnetic structure MS1. Referring to FIG. 4B, as another example, the magnetization directions MD1 and MD2 of the first and second magnetic structures MS1 and MS2 may be perpendicular to the interface between the tunnel barrier pattern TBR and the second magnetic structure MS2. In this case, each of the first and second magnetic structures MS1 and MS2 may include at least one selected from a perpendicular magnetic material (e.g., CoFeTb, CoFeGd, or CoFeDy), a perpendicular magnetic material having an L10 structure, CoPt of a hexagonal close packed (HCP) lattice structure, and a perpendicular magnetization structure. The perpendicular magnetic material having the L10 structure may include at least one selected from FePt of the L10 structure, FePd of the L10 structure, CoPd of the L10 structure, and CoPt of the L10 structure. The perpendicular magnetization structure may include magnetic layers and non-magnetic layers that are alternately and repeatedly stacked. For example, the perpendicular magnetization structure may include at least one selected from (Co/Pt)n, (CoFe/Pt)n, (CoFe/Pd)n, (Co/Pd)n, (Co/Ni)n, (CoNi/Pt)n, (CoCr/Pt)n, and (CoCr/Pd)n (where, n is the number of stacked layers).

According to some example embodiments, each of the first and second magnetic structures MS1 and MS2 may include a Heusler alloy. The Heusler alloy may include a Co-based full-Heusler alloy. The Co-based full-Heusler alloy may include at least one selected from $Co_2FeSi$, $Co_2MnSi$, $Co_2FeMnSi$, $Co_2FeAl$, and $Co_2CrAl$.

The tunnel barrier pattern TBR may include at least one selected from a magnesium (Mg) oxide layer, a titanium (Ti) oxide layer, an aluminum (Al) oxide layer, a magnesium-zinc (Mg—Zn) oxide layer, and a magnesium-boron (Mg—B) oxide layer.

Referring back to FIGS. 2 and 3, the second interlayer dielectric layer 110 on the cell region CR may have a recession 110R that is recessed toward the substrate 100 on opposite sides of the data storage structure DS (e.g., between the plurality of data storage structures DS) and thus on opposite sides of the magnetic tunnel junction pattern MTJ (e.g., between the plurality of magnetic tunnel junction patterns MTJ). The recession 110R may have a lowermost surface located at a lower level than that of the top surface of the lower electrode contact 120.

A first capping dielectric layer 130 may cover a lateral surface of the data storage structure DS. When viewed in plan, the first capping dielectric layer 130 may surround the lateral surface of the data storage structure DS. For example, the first capping dielectric layer 130 may cover lateral surfaces of the bottom electrode BE, the magnetic tunnel junction pattern MTJ, and the top electrode TE, and when viewed in plan, the first capping dielectric layer 130 may surround the lateral surfaces of the bottom electrode BE, the magnetic tunnel junction pattern MTJ, and the top electrode TE. As shown at least FIG. 3, the first capping dielectric layer 130 may extend onto an inner surface 110Ri of the recession 110R of the second interlayer dielectric layer 110, and may conformally cover an inner sidewall 110Ris and a bottom surface 110Rib of the recession 110R.

A second capping dielectric layer 132 may be disposed on the first capping dielectric layer 130. The second capping dielectric layer 132 may cover a lateral surface of the first capping dielectric layer 130 and the lateral surface of the data storage structure DS. As shown in at least FIG. 3, the second capping dielectric layer 132 may fill a portion of the recession 110R of the second interlayer dielectric layer 110 and may extend onto a top surface 130T of the first capping dielectric layer 130. As shown in FIG. 3, the first capping dielectric layer 130 and the second capping dielectric layer 132 may be understood to be sequentially stacked on a lateral (e.g., sidewall) surface of the magnetic tunnel junction pattern MTJ. The second capping dielectric layer 132 may conformally cover the first capping dielectric layer 130. The first capping dielectric layer 130 may be interposed between the second capping dielectric layer 132 and the lateral surface of the data storage structure DS, and may extend between the second capping dielectric layer 132 and an inner surface of the recession 110R. The first and second capping dielectric layers 130 and 132 may expose a top surface of the top electrode TE.

Each of the first and second capping dielectric layers 130 and 132 may have a thickness in the first direction D1. For example, the first capping dielectric layer 130 may have a first thickness T1 of about 100 Å to about 250 Å. For example, the second capping dielectric layer 132 may have a second thickness T2 of about 100 Å to about 250 Å. The first thickness T1 of the first capping dielectric layer 130 may be substantially identical or similar to the second thickness T2 of the second capping dielectric layer 132.

The first and second capping dielectric layers 130 and 132 may include a dielectric material, for example, silicon nitride, silicon oxynitride, silicon carbon nitride, silicon carbon oxynitride, or aluminum nitride. In some example embodiments, the first and second capping dielectric layers 130 and 132 may include the same elements, for example, silicon nitride (SiN). For example, each of the first and second capping dielectric layers 130 and 132 may include nitrogen. In some example embodiments, the first and second capping dielectric layers 130 and 132 may have different amounts (e.g., different concentrations, densities, and/or absolute amounts) of nitrogen. Restated, an amount of nitrogen in the first capping dielectric layer 130 may be different from an amount of nitrogen in the second capping dielectric layer 132. In some example embodiments, the first and second capping dielectric layers 130 and 132 may have the same amount (e.g., same concentration, density, and/or absolute amount) of nitrogen. Restated, an amount of nitrogen in the first capping dielectric layer 130 may be the same as an amount of nitrogen in the second capping dielectric layer 132.

Figure 7:
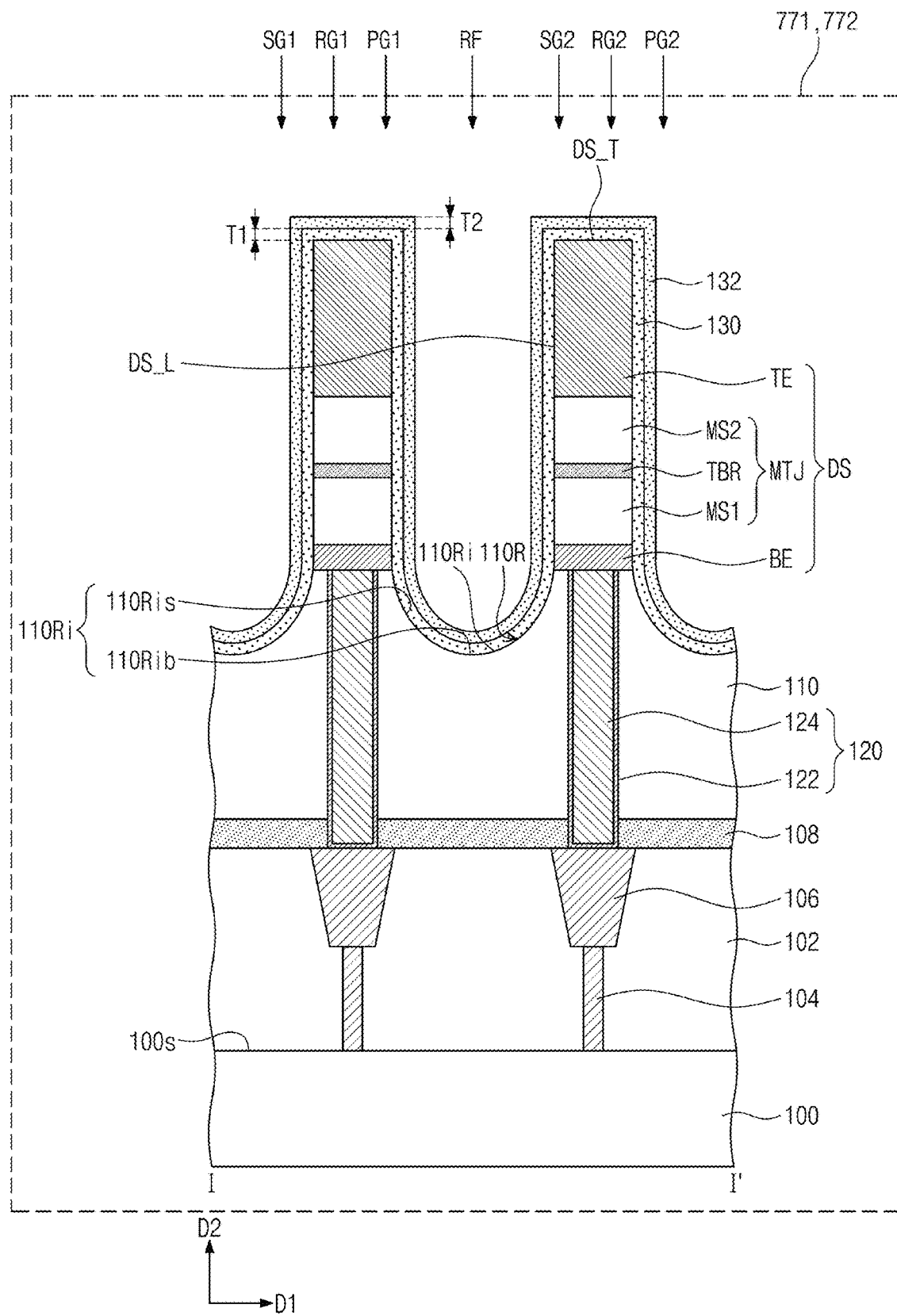

The first and second capping dielectric layers 130 and 132 may be formed by different methods from each other. With reference to FIG. 7, the following description will focus on methods of forming the first and second capping dielectric layers 130 and 132.

The second capping dielectric layer 132 may be provided thereon with a third interlayer dielectric layer 140 (e.g., first upper interlayer dielectric layer) that covers the cell region CR. The third interlayer dielectric layer 140 may cover the data storage structure DS. The second capping dielectric layer 132 may be interposed between the first capping dielectric layer 130 and the third interlayer dielectric layer 140, and may extend between the third interlayer dielectric layer 140 and the inner surface of the recession 110R of the second interlayer dielectric layer 110.

The third interlayer dielectric layer 140 may include at least one selected from oxide, nitride, and oxynitride. The first and second capping dielectric layers 130 and 132 may include their materials different from those of the second and third interlayer dielectric layers 110 and 140. The first and second capping dielectric layers 130 and 132 may include a material having an etch selectivity with respect to the second and third interlayer dielectric layers 110 and 140.

A fourth interlayer dielectric layer 145 (e.g., a second upper interlayer dielectric layer) may be disposed on the third interlayer dielectric layer 140, and an upper dielectric layer 142 may be interposed between the third interlayer dielectric layer 140 and the fourth interlayer dielectric layer 145. The upper dielectric layer 142 and the fourth interlayer dielectric layer 145 may cover the cell region CR. The fourth interlayer dielectric layer 145 may include, for example, at least one selected from oxide, nitride, and oxynitride. The upper dielectric layer 142 may include a different material from those of the third and fourth interlayer dielectric layers 140 and 145. For example, the upper dielectric layer 142 may include a material that is absent from the third and fourth interlayer dielectric layers 140 and 145. The upper dielectric layer 142 may include a material having an etch selectivity with respect to the third and fourth interlayer dielectric layers 140 and 145. The upper dielectric layer 142 may include nitride (e.g., silicon nitride).

An upper line 150 may be disposed on the cell region CR of the substrate 100. The upper line 150 may be provided in plural, and the plurality of upper lines 150 may be disposed spaced apart from each other in the first direction D1. Each of the plurality of upper lines 150 may be connected to a corresponding one of the plurality of data storage structures DS.

The upper line 150 may penetrate the fourth interlayer dielectric layer 145 and the upper dielectric layer 142 and may have connection with the data storage structure DS. The top surface of the top electrode TE in the data storage structure DS may be in contact with a bottom surface of the upper line 150. The upper line 150 may cover the top surface of the top electrode TE. The upper line 150 may include an upper line pattern 154 and an upper barrier pattern 152. The upper line pattern 154 may penetrate the upper dielectric layer 142 and the fourth interlayer dielectric layer 145. The upper barrier pattern 152 may be interposed between the fourth interlayer dielectric layer 145 and a lateral surface of the upper line pattern 154 and between the upper dielectric layer 142 and the lateral surface of the upper line pattern 154, and may extend between a bottom surface of the upper line pattern 154 and the top surface of the top electrode TE. The upper line pattern 154 may include a conductive metallic material, for example, copper (Cu). The upper barrier pattern 152 may include conductive metal nitride.

According to some example embodiments, differently from that shown, the upper line 150 may extend onto and partially cover a lateral surface of the top electrode TE, and the upper barrier pattern 152 may extend onto and partially cover the lateral surface of the top electrode TE.

FIGS. 5, 6, 7, 8, 9, and 10 illustrate cross-sectional views taken along line I-I' of FIG. 2, showing a method of fabricating a magnetic memory device according to some example embodiments of the present inventive concepts. For brevity of description, omission will be made to avoid duplicate explanation of the magnetic memory device discussed with reference to FIGS. 1 to 3, 4A, and 4B.

Figure 5:
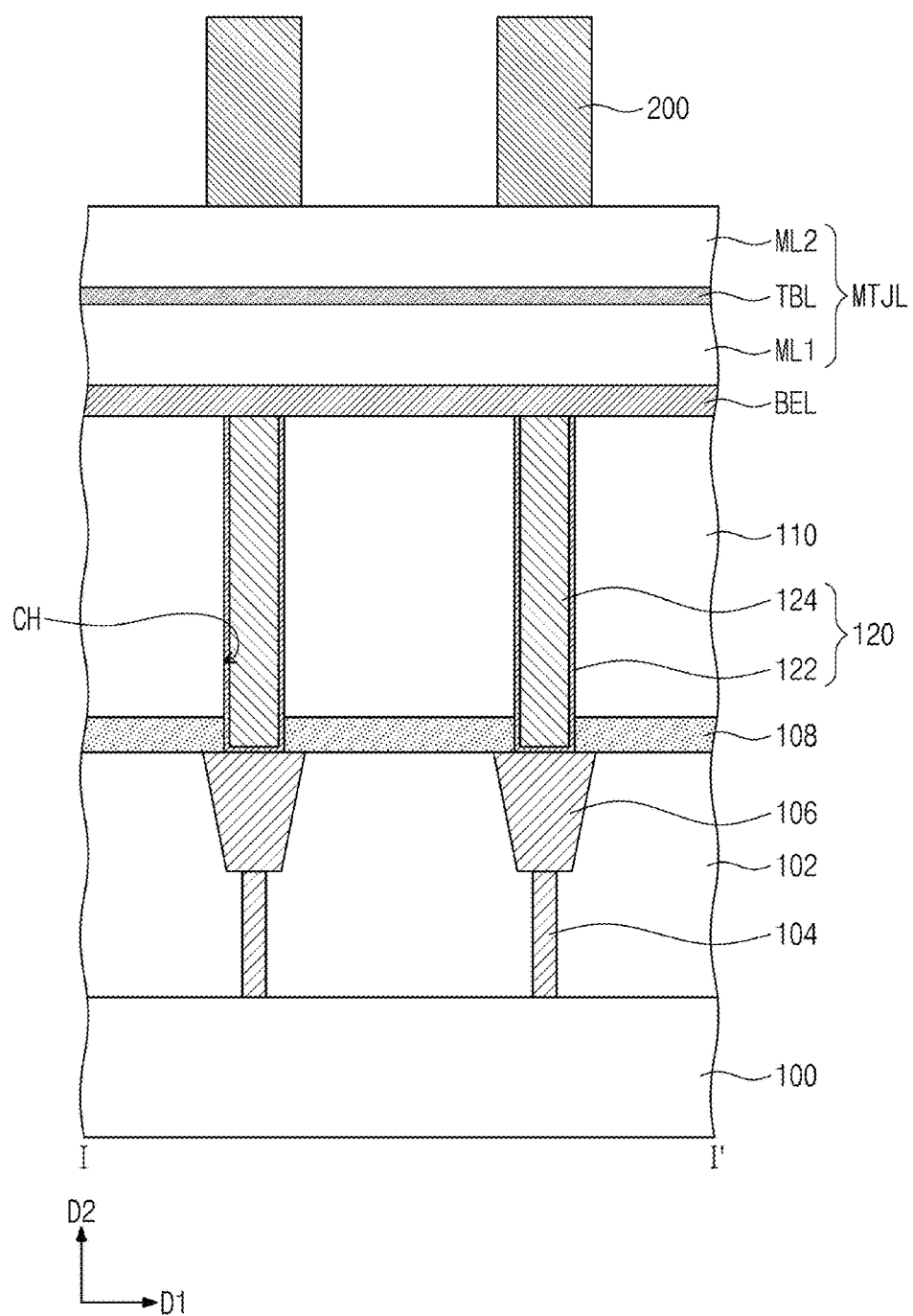
FIGS. 5, 6, 7, 8, 9, and 10 illustrate cross-sectional views taken along line I-I' of FIG. 2, showing a method of fabricating a magnetic memory device according to some example embodiments of the present inventive concepts.

Referring to FIG. 5, a substrate 100 may be provided. Select elements (not shown) may be formed in the substrate 100. A first interlayer dielectric layer 102 may be formed on the substrate 100, thereby covering the substrate 100. Lower lines 106 and lower contacts 104 may be formed on the substrate 100. The formation of the lower lines 106 and the lower contacts 104 may include forming through holes that penetrate the first interlayer dielectric layer 102 and filling the through holes. The lower lines 106 may have their top surfaces substantially coplanar with that of the first interlayer dielectric layer 102. The first interlayer dielectric layer 102 may be formed by performing a chemical vapor deposition process, a physical vapor deposition process, or an atomic layer deposition process.

A lower dielectric layer 108 may be formed on the first interlayer dielectric layer 102. A second interlayer dielectric layer 110 may be formed on the lower dielectric layer 108. The lower dielectric layer 108 and the second interlayer dielectric layer 110 may be formed to cover the substrate 100. Each of the lower dielectric layer 108 and the second interlayer dielectric layer 110 may be formed by performing a chemical vapor deposition process, a physical vapor deposition process, or an atomic layer deposition process.

A lower electrode contact 120 may be formed on the substrate 100. The lower electrode contact 120 may penetrate the second interlayer dielectric layer 110 and the lower dielectric layer 108 and may have connection with a corresponding one of the lower lines 106. The formation of the lower electrode contact 120 may include forming a lower contact hole CH that penetrates the second interlayer dielectric layer 110 and the lower dielectric layer 108, sequentially forming on the lower lines 106 a lower barrier layer and a lower electrode layer to fill the lower contact hole CH, and allowing the lower barrier layer and the lower electrode layer to undergo a planarization process until a top surface of the second interlayer dielectric layer 110 is exposed. The lower barrier layer may be formed to conformally cover an inner sidewall and a bottom surface of the lower contact hole CH. The lower electrode layer may be formed to fill a remaining portion of the lower contact hole CH. The lower electrode layer may include at least one of doped semiconductor materials (e.g., doped silicon), metals (e.g., tungsten, titanium, tantalum, cobalt, molybdenum, and/or ruthenium), and metal-semiconductor compounds (e.g., metal silicide), and the lower barrier layer may include conductive metal nitride (e.g., titanium nitride, tantalum nitride, and/or tungsten nitride).

The planarization process may locally form a lower barrier pattern 122 and a lower electrode pattern 124 in the lower contact hole CH. Therefore, the lower electrode contact 120 may have a top surface that is exposed without being covered with the second interlayer dielectric layer 110.

A bottom electrode layer BEL and a magnetic tunnel junction layer MTJL may be sequentially formed on the second interlayer dielectric layer 110. The bottom electrode layer BEL may be formed to cover the top surface of the lower electrode contact 120 and the top surface of the second interlayer dielectric layer 110. The magnetic tunnel junction layer MTJL may include a first magnetic layer ML1, a tunnel barrier layer TBL, and a second magnetic layer ML2 that are sequentially stacked on the bottom electrode layer BEL. Each of the first and second magnetic layers ML1 and ML2 may include at least one magnetic layer. The first magnetic layer ML1, the tunnel barrier layer TBL, and the second magnetic layer ML2 may be formed by a sputtering process, a chemical vapor deposition process, or an atomic layer deposition process.

A conductive mask pattern 200 may be formed on the magnetic tunnel junction layer MTJL. The conductive mask pattern 200 may define an area on which is formed a magnetic tunnel junction pattern which will be discussed below. The conductive mask pattern 200 may include at least one selected from metal (e.g., Ta, W, Ru, and/or Ir) and conductive metal nitride (e.g., TiN).

Figure 6:
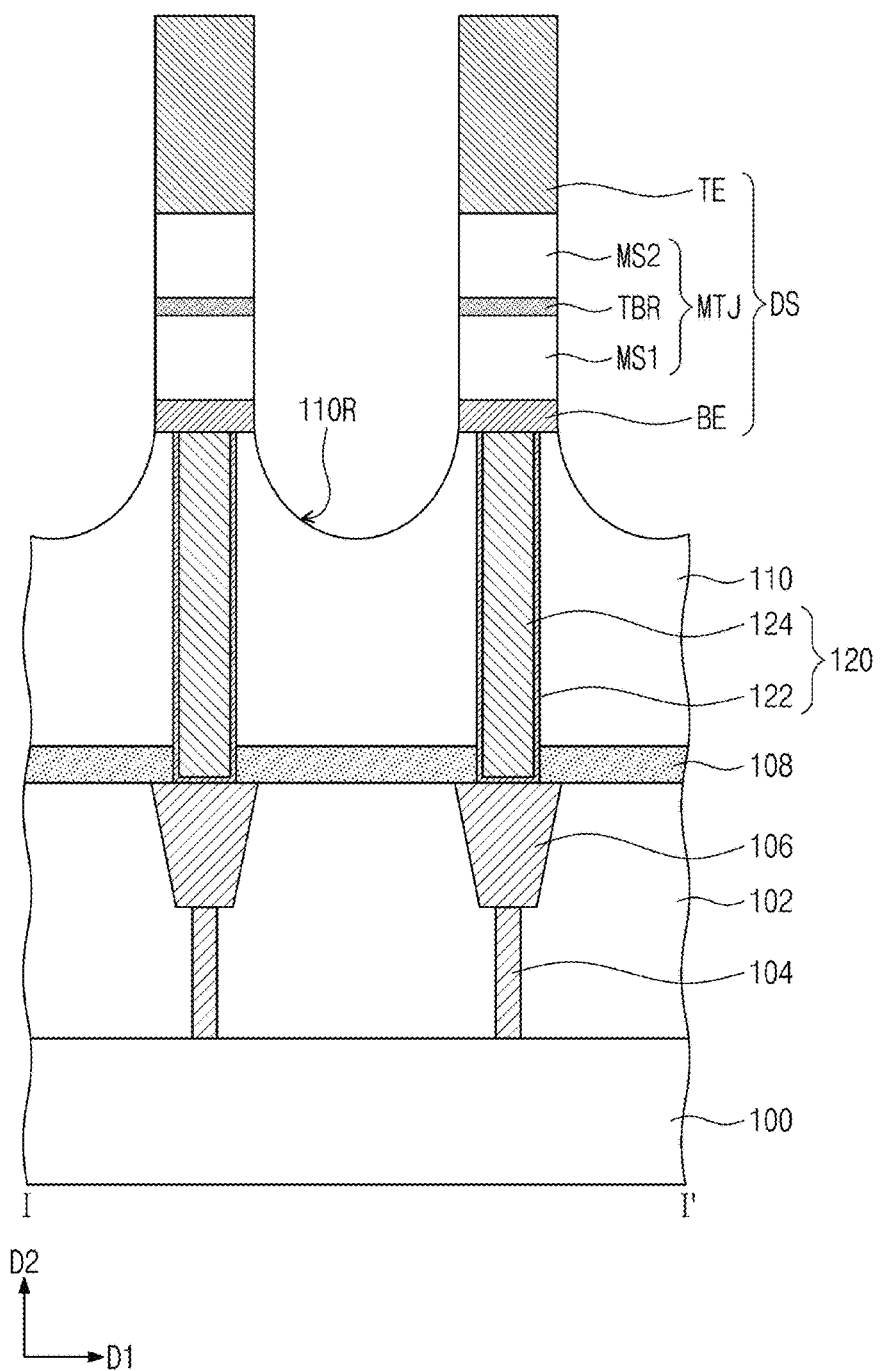

Referring to FIG. 6, the conductive mask pattern 200 may be used as an etching mask to sequentially etch the magnetic tunnel junction layer MTJL and the bottom electrode layer BEL. Therefore, a magnetic tunnel junction pattern MTJ and a bottom electrode BE may be formed on the second interlayer dielectric layer 110. The bottom electrode BE may be connected to the lower electrode contact 120, and the magnetic tunnel junction pattern MTJ may be formed on the bottom electrode BE. The magnetic tunnel junction pattern MTJ may include a first magnetic structure MS1, a tunnel barrier pattern TBR, and a second magnetic structure MS2 that are sequentially stacked on the bottom electrode BE. The first magnetic structure MS1 and the second magnetic structure MS2 may be spaced apart from each other across the tunnel barrier pattern TBR. The etching of the magnetic tunnel junction layer MTJL may include using the conductive mask pattern 200 as an etching mask to sequentially etch the second magnetic layer ML2, the tunnel barrier layer TBL, and the first magnetic layer ML1. The second magnetic layer ML2, the tunnel barrier layer TBL, and the first magnetic layer ML1 may be etched to form the second magnetic structure MS2, the tunnel barrier pattern TBR, and the first magnetic structure MS1, respectively.

For example, an ion beam etching process using an ion beam may be employed as an etching process to etch the magnetic tunnel junction layer MTJL and the bottom electrode layer BEL. The ion beam may include inert ions. The etching process may cause that an upper portion of the second interlayer dielectric layer 110 is recessed on opposite sides of the magnetic tunnel junction pattern MTJ. Thus, the second interlayer dielectric layer 110 may have a recession 110R that is recessed toward the substrate 100 on opposite sides of the magnetic tunnel junction pattern MTJ. The recession 110R may have a lowermost surface located at a lower level (height) than that of the top surface of the lower electrode contact 120.

After the etching process, a residue of the conductive mask pattern 200 may remain on the magnetic tunnel junction pattern MTJ. The residue of the conductive mask pattern 200 may serve as a top electrode TE. In the following description, the residue of the conductive mask pattern 200 may be called the top electrode TE. The top electrode TE, the magnetic tunnel junction pattern MTJ, and the bottom electrode BE may constitute a data storage structure DS. Accordingly, as shown in FIGS. 5-6, a method of fabricating a magnetic memory device may include forming the data storage structure DS on the substrate 100, which includes sequentially forming the bottom electrode BE, the magnetic tunnel junction pattern MTJ, and the top electrode TE on the substrate 100. As shown in FIG. 6, the forming of the data storage structure DS may form the recession 110R on the upper portion of the second interlayer dielectric layer 110 (e.g., a portion of the second interlayer dielectric layer 110 that is distal from the substrate 100), where the recession 110R is recessed toward the substrate 100 on opposite sides of the magnetic tunnel junction pattern MTJ.

As shown in FIGS. 5-6, the first and second lower interlayer dielectric layers 102 and 110 may be sequentially formed on the substrate prior to the forming of the data storage structure(s) DS, such that the first and second lower interlayer dielectric layers 102 and 110 may be between the data storage structure(s) DS and the substrate 100. In some example embodiments, the first and second lower interlayer dielectric layers 102 and 110 may be absent. As further shown in FIGS. 5-6, the method may include forming a lower electrode contact 120 on the first lower interlayer dielectric layer 102, such that the lower electrode contact 120 penetrates the second interlayer dielectric layer 110.

Referring to FIG. 7, a first capping dielectric layer 130 may be formed on the second interlayer dielectric layer 110, thereby covering the data storage structure DS. As shown in FIG. 7 first capping dielectric layer 130 may be formed in the method of fabricating a magnetic memory device to conformally cover top and lateral surfaces DS_T and DS_L of the data storage structure DS, and may extend along and conformally cover an inner surface 110Ri of the recession 110R. As shown in at least FIG. 7, the first capping dielectric layer 130 may extend onto an inner surface 110Ri of the recession 110R and, as shown, conformally covers an inner sidewall 110Ris and a bottom surface 110Rib of the recession 110R.

The first capping dielectric layer 130 may be formed by or based on, for example, a plasma-enhanced chemical vapor deposition (PECVD) process. For example, referring to FIGS. 6 and 7, the device shown therein with exposed inner surfaces 110Ri of the recession 110R and exposed surfaces of the data storage structure DS may be located in a chamber (e.g., first chamber 771) into which gases may be applied and in which a radio-frequency (RF) power may be generated and/or applied. The formation of the first capping dielectric layer 130 may include supplying a first source gas SG1, a first reaction gas RG1, and a first purging gas PG1 from separate gas supplies (e.g., supplied from separate, respective pressurized gas containers via a control valve connected thereto) into the first chamber 771 while the device shown in FIG. 6 is located in the first chamber 771, and applying a radio-frequency (RF) power to generate plasma in the first chamber 771 while the device is located therein and the supplied first source gas SG1, first reaction gas RG1, and first purging gas PG1 are located in the first chamber 771, in the vicinity of the data storage structures DS. The RF power may be applied in the chamber based on creating an RF discharge between two conductive (e.g., metal) electrodes within the chamber where the supplied gases and the device including the data storage structure DS may be located between the electrodes within the chamber. The first source gas SG1 may be a silicon-containing gas, for example, at least one selected from $SiI_2H_2$, diIsopropylaminosilane (DIPAS), $SiH_4$, $Si_2H_6$, DCS, hexachlorodisilane (HCD), tetrachlorosilane (TCS), and trisilylamine (TSA). The first reaction gas RG1 may be a nitrogen-containing gas, for example, $N_2$. The first purging gas PG1 may be an inert gas, for example, He. The RF power may generate nitrogen plasma in the first chamber 771 from the first reaction gas RG1 present in the chamber, and the nitrogen plasma may react with a silicon source adsorbed on a sidewall of the data storage structure DS in the first chamber 771, thereby forming silicon nitride. Accordingly, the first capping dielectric layer 130 may include silicon nitride. The first capping dielectric layer 130 may be formed (e.g., the forming the first capping dielectric layer 130 may be performed) under a temperature of about 275° C. to about 325° C. (e.g., when the device including the data storage structure DS is located in the first chamber 771 while the internal temperature of the first chamber 771 is a temperature of about 275° C. to about 325° C.). For example, the first capping dielectric layer 130 may be formed under a relatively low temperature. The first reaction gas RG1 may not include NH$_3$. In some example embodiments, each of the first source gas SG1, the first reaction gas RG1, and the first purging gas PG1 does not include NH$_3$. The first capping dielectric layer 130 may be in-situ formed in the same chamber where the data storage structure DS is formed.

As shown in FIG. 7, a method of fabricating a magnetic memory device may include second capping dielectric layer 132 may be formed on the first capping dielectric layer 130. As shown in FIG. 7, the second capping dielectric layer 132 may fill a portion (e.g., a limited portion) of the recession 110R, and may extend onto a top surface of the first capping dielectric layer 130. The second capping dielectric layer 132 may be formed to conformally cover the first capping dielectric layer 130.

The second capping dielectric layer 132 may be formed by a different method from that used for forming the first capping dielectric layer 130. In some example embodiments, the second capping dielectric layer 132 may be formed by a plasma-enhanced chemical vapor deposition (PECVD) process. For example, referring to FIGS. 6 and 7, the device shown therein with exposed surfaces of the first capping dielectric layer 130 may be located in a chamber (e.g., a second chamber 772) into which gases may be applied and in which a radio-frequency (RF) channel may be generated and/or applied. Said second chamber 772 may be the same chamber in which the device is located during the formation of the first capping dielectric layer 130 based on a PECVD process (e.g., the second chamber 772 and the first chamber 771 may be the same chamber). The formation of the second capping dielectric layer 132 may include supplying a second source gas SG2, a second reaction gas RG2, and a second purging gas PG2 into the second chamber 772 (e.g., supplied from separate, respective pressurized gas containers via a control valve connected thereto) while the device shown in FIG. 7 is located in the second chamber 772, and applying a radio-frequency (RF) power to generate plasma in the second chamber 772 while the device is located therein and the supplied second source gas SG2, second reaction gas RG2, and second purging gas PG2 are located in the second chamber 772, in the vicinity of the data storage structures DS. The second source gas SG2 may be the same as or different from the first source gas SG1. The second source gas SG2 may be a silicon-containing gas, for example, at least one selected from SiI$_2$H$_2$, dilsopropylaminosilane (DI-PAS), SiH$_4$, Si$_2$H$_6$, DCS, hexachlorodisilane (HCD), tetrachlorosilane (TCS), and trisilylamine (TSA). The second reaction gas RG2 may be different from the first reaction gas RG1. The second reaction gas RG2 may be a nitrogen-containing gas, for example, NH$_3$. The second purging gas PG2 may be different from the first purging gas PG1. The second purging gas PG2 may be an inert gas, for example, N$_2$. The RF power may generate nitrogen plasma from the second reaction gas RG2, and the nitrogen plasma may react with a silicon source adsorbed on the sidewall of the data storage structure DS, thereby forming silicon nitride. Accordingly, the second capping dielectric layer 132 may include silicon nitride. The second capping dielectric layer 132 may be formed (e.g., the forming the second capping dielectric layer 132 may be performed) under a temperature of about 350° C. to about 400° C. (e.g., when the device including the data storage structure DS and the first capping dielectric layer 130 is located in the second chamber 772 while the internal temperature of the second chamber 772 is a temperature of about 350° C. to about 400° C.). For example, the second capping dielectric layer 132 may be formed under a higher temperature than that under which the first capping dielectric layer 130 is formed. In some example embodiments, the second capping dielectric layer 132 may be in-situ formed in the same chamber where the first capping dielectric layer 130 is formed. In some example embodiments, the second capping dielectric layer 132 may be ex-situ formed in a different chamber from that used for forming the first capping dielectric layer 130.

In some example embodiments, the first capping dielectric layer 130 and the second capping dielectric layer 132 may be formed to respectively have a first thickness T1 and a second thickness T2 in a direction parallel to a top surface 100s of the substrate 100. The first thickness T1 of the first capping dielectric layer 130 may be in a range of about 100 Å to about 250 Å. The second thickness T2 of the second capping dielectric layer 132 may be in a range of about 100 Å to about 250 Å.

In some example embodiments, the second capping dielectric layer 132 may be formed by a physical vapor deposition (PVD) process or an ion beam deposition (IBD) process.

In general, when the data storage structure DS is exposed to a high-temperature process and a plasma-enhanced chemical vapor deposition (PECVD) process performed by supplying NH$_3$ while a capping dielectric layer is formed on the data storage structure DS, the magnetic tunnel junction pattern MTJ may be damaged due to plasma and thus may have reduced characteristics.

According to the present inventive concepts, because the first capping dielectric layer 130 is formed by performing a plasma-enhanced chemical vapor deposition (PECVD) process under a relatively low temperature without supplying NH$_3$, the magnetic tunnel junction pattern MTJ may be prevented from reduction in characteristics. In addition, because the second capping dielectric layer 132 is formed on the first capping dielectric layer 130, the magnetic tunnel junction pattern MTJ may be prevented from property deterioration resulting from subsequent processes.

Figure 8:
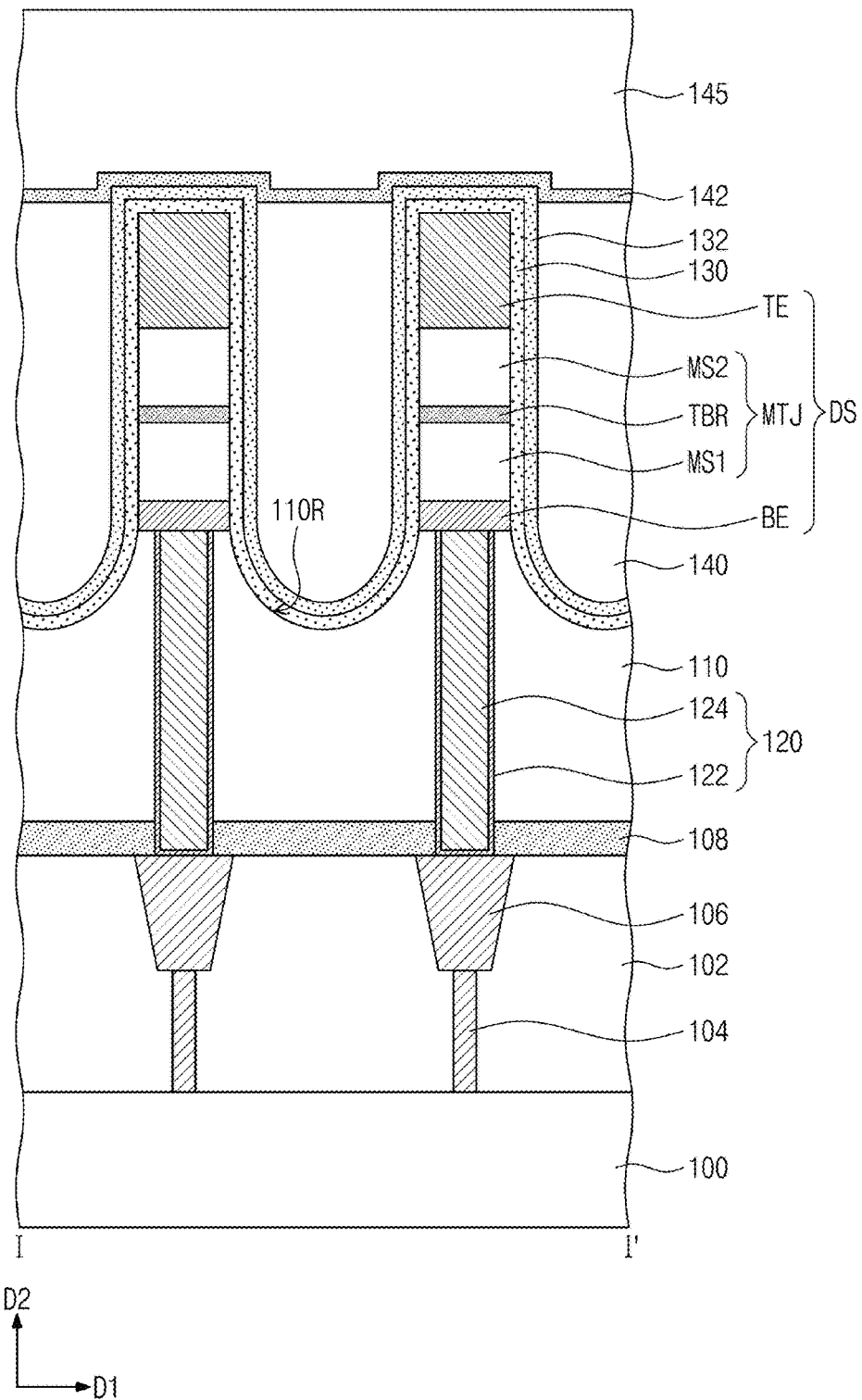

Referring to FIG. 8, a third interlayer dielectric layer 140 may be formed on the second capping dielectric layer 132, thereby covering the data storage structure DS. The third interlayer dielectric layer 140 may be formed to fill a remaining portion of the recession 110R. In some example embodiments, the third interlayer dielectric layer 140 may partially expose a top surface of the second capping dielectric layer 132. An upper dielectric layer 142 may be formed on the third interlayer dielectric layer 140. The upper dielectric layer 142 may be interposed between the third interlayer dielectric layer 140 and a fourth interlayer dielectric layer 145 which will be discussed below. In some example embodiments, the upper dielectric layer 142 may cover a portion of the top surface of the second capping dielectric layer 132. A fourth interlayer dielectric layer 145 may be formed on the upper dielectric layer 142. The fourth interlayer dielectric layer 145 may be formed to cover a top surface of the upper dielectric layer 142. The third and fourth interlayer dielectric layers 140 and 145 and the upper dielectric layer 142 may each be formed by performing a chemical vapor deposition process, a physical vapor deposition process, or an atomic layer deposition process.

Figure 9:
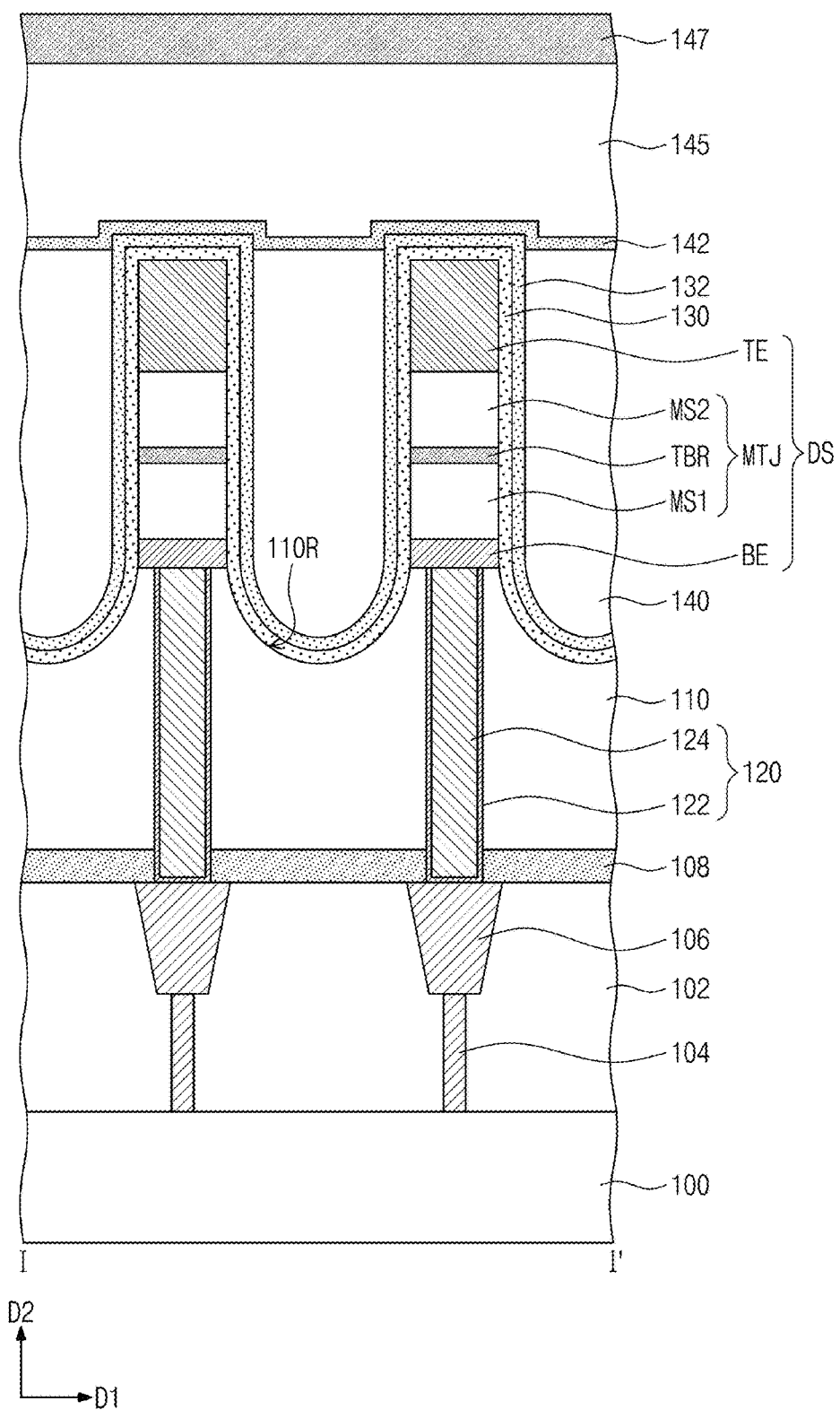

Referring to FIG. 9, a sacrificial layer 147 may be formed on the fourth interlayer dielectric layer 145. The sacrificial layer 147 may cover the fourth interlayer dielectric layer 145. The sacrificial layer 147 may include, for example, a carbon-containing material.

Figure 10:
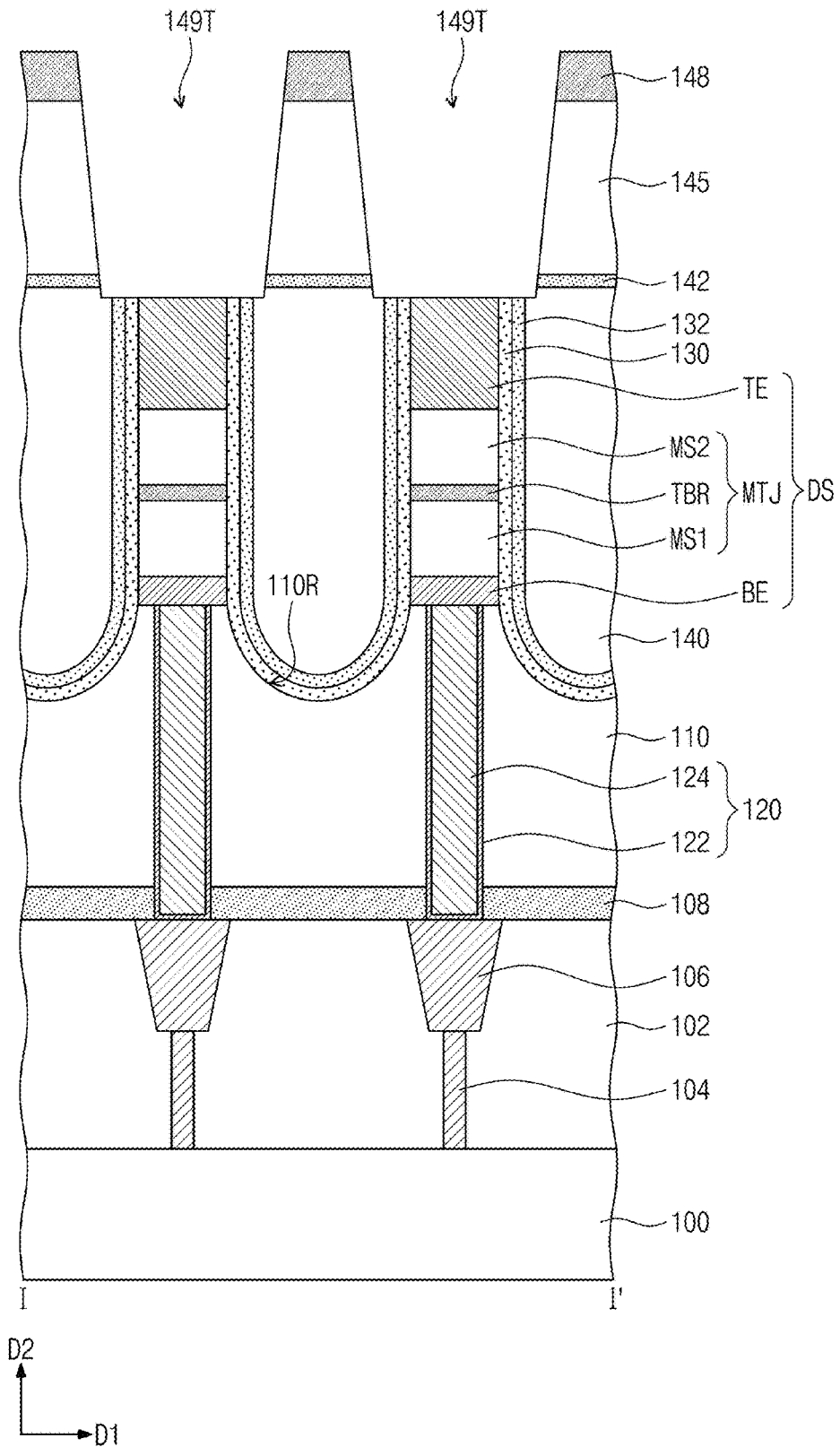

Referring to FIG. 10, an etching process may be performed to pattern the sacrificial layer 147, the fourth interlayer dielectric layer 145, and the upper dielectric layer 142, and thus a trench 149T may be formed in the fourth interlayer dielectric layer 145. The trench 149T may expose a top surface of the top electrode TE.

For example, the etching process may include a first etching process and a second etching process. The first etching process may continue until the second capping dielectric layer 132 is exposed. During the first etching process, an etch rate of the sacrificial layer 147 may be greater than that of each of the fourth interlayer dielectric layer 145, the upper dielectric layer 142, the third interlayer dielectric layer 140, the first capping dielectric layer 130, the second capping dielectric layer 132, and the second interlayer dielectric layer 110. As the sacrificial layer 147 is etched by the first etching process, a top surface of the fourth interlayer dielectric layer 145 may be exposed during the first etching process.

The second etching process may etch the first capping dielectric layer 130 and a portion of the second capping dielectric layer 132 exposed by the first etching process. Therefore, the trench 149T may expose the top surface of the top electrode TE.

According to some example embodiments, differently from that shown, the second etching process may cause the trench 149T to extend onto and partially expose a lateral surface of the top electrode TE.

Referring back to FIGS. 2 and 3, an upper line 150 may be formed in the trench 149T. The upper line 150 may include an upper line pattern 154 and an upper barrier pattern 152. The upper barrier pattern 152 may be formed to extend along lateral and bottom surfaces of the upper line pattern 154.

The formation of the upper line 150 may include forming on the fourth interlayer dielectric layer 145 a barrier layer that fills a portion of the trench 149T, forming on the barrier layer a conductive layer that fills a remaining portion of the trench 149T, and allowing the conductive layer and the barrier layer to undergo a planarization process until the top surface of the fourth interlayer dielectric layer 145 is exposed. The barrier layer may be formed to conformally cover an inner sidewall and a bottom surface of the trench 149T. The barrier layer may include conductive metal nitride, and the conductive layer may include metal (e.g., copper). The planarization process may cause that a top surface of the upper line pattern 154 and an uppermost surface of the upper barrier pattern 152 are substantially coplanar with the top surface of the fourth interlayer dielectric layer 145.

According to some example embodiments of the present inventive concepts, a first capping dielectric layer may be formed on a magnetic tunnel junction pattern by performing a plasma-enhanced chemical vapor deposition (PECVD) process under a relatively low temperature without supplying $NH_3$, and as a result the magnetic tunnel junction pattern may be prevented from reduction in characteristics. Moreover, a second capping dielectric layer may be formed on the first capping dielectric layer, and thus the magnetic tunnel junction pattern may be prevented from property deterioration resulting from subsequent processes.

The aforementioned description provides some example embodiments for explaining the present inventive concepts. Therefore, the present inventive concepts are not limited to the example embodiments described above, and it will be understood by one of ordinary skill in the art that variations in form and detail may be made therein without departing from the spirit and essential features of the present inventive concepts.

What is claimed is:

1. A method of fabricating a magnetic memory device, the method comprising:
   forming a data storage structure on a substrate, wherein forming the data storage structure includes sequentially forming a bottom electrode, a magnetic tunnel junction pattern, and a top electrode on the substrate;
   forming a first capping dielectric layer that conformally covers a lateral surface and a top surface of the data storage structure; and
   forming a second capping dielectric layer on the first capping dielectric layer,
   wherein forming the first capping dielectric layer is performed based on a first plasma-enhanced chemical vapor deposition (PECVD) process in which a first source gas, a first reaction gas, and a first purging gas are supplied into a first chamber in which the data storage structure and the substrate are located,
   wherein forming the second capping dielectric layer is performed based on a second plasma-enhanced chemical vapor deposition (PECVD) process in which a second source gas, a second reaction gas, and a second purging gas are supplied into a second chamber in which the first capping dielectric layer, the data storage structure and the substrate are located,
   wherein the first and second reaction gases are different from each other, and
   wherein the first and second purging gases are different from each other.

2. The method of claim 1, wherein
   each of the first and second source gases includes a silicon-containing gas,
   the first reaction gas includes $N_2$, and
   the second reaction gas includes $NH_3$.

3. The method of claim 1, wherein
   each of the first and second purging gases includes an inert gas,
   the first purging gas includes He, and
   the second purging gas includes $N_2$.

4. The method of claim 1, wherein
   each of the first source gas, the first reaction gas, and the first purging gas does not include $NH_3$, and
   the second reaction gas includes $NH_3$.

5. The method of claim 1, wherein
   forming the first capping dielectric layer is performed under a temperature of about 275° C. to about 325° C., and
   forming the second capping dielectric layer is performed under a temperature of about 350° C. to about 400° C.

6. The method of claim 1, wherein each of the first and second capping dielectric layers includes silicon nitride.

7. The method of claim 1, wherein
   the first capping dielectric layer and the second capping dielectric layer are formed to respectively have a first thickness and a second thickness in a direction parallel to a top surface of the substrate,
   the first thickness of the first capping dielectric layer is in a range of about 100 Å to about 250 Å, and
   the second thickness of the second capping dielectric layer is in a range of about 100 Å to about 250 Å.

8. The method of claim 1, further comprising:
   sequentially forming a first interlayer dielectric layer and a second interlayer dielectric layer on the substrate prior to forming the data storage structure, such that the forming of the data storage structure causes the first and second interlayer dielectric layers to be between the data storage structure and the substrate; and forming a lower electrode contact on the first interlayer dielectric layer, such that the lower electrode contact penetrates the second interlayer dielectric layer.

9. The method of claim 8, wherein forming the data storage structure forms a recession on an upper portion of the second interlayer dielectric layer, the recession being recessed toward the substrate on opposite sides of the magnetic tunnel junction pattern.

10. The method of claim 9, wherein
the first capping dielectric layer extends onto an inner surface of the recession and conformally covers an inner sidewall and a bottom surface of the recession, and
the second capping dielectric layer fills a portion of the recession and extends onto a top surface of the first capping dielectric layer.

11. A method of fabricating a magnetic memory device, the method comprising:
forming a data storage structure on a substrate, wherein forming the data storage structure includes sequentially forming a bottom electrode, a magnetic tunnel junction pattern, and a top electrode on the substrate;
forming a first capping dielectric layer that conformally covers a lateral surface and a top surface of the data storage structure, based on performing a first plasma-enhanced chemical vapor deposition (PECVD) process in which a first source gas, a first reaction gas, and a first purging gas are supplied into a first chamber in which the data storage structure and the substrate are located; and
forming a second capping dielectric layer on the first capping dielectric layer based on performing a second plasma-enhanced chemical vapor deposition (PECVD) process in which a second source gas, a second reaction gas, and a second purging gas are supplied into a second chamber in which the first capping dielectric layer, the data storage structure and the substrate are located,
wherein each of the first and second capping dielectric layers includes silicon nitride,
wherein forming the first capping dielectric layer and forming the second capping dielectric layer are performed by different methods from each other,
wherein forming the first capping dielectric layer is performed under a temperature of about 275° C. to about 325° C.,
wherein forming the second capping dielectric layer is performed under a temperature of about 350° C. to about 400° C.,
wherein
the first and second reaction gases are different from each other, or
the first and second purging gases are different from each other, or
the first and second reaction gases are different from each other and the first and second purging gases are different from each other, and wherein
the first capping dielectric layer contacts and surrounds, in a plan view an entire lateral surface of each of the bottom electrode, the magnetic tunnel junction pattern, and the top electrode, and
the second capping dielectric layer on the first capping dielectric layer surrounds, in a plan view, the entire lateral surface of each of the bottom electrode, the magnetic tunnel junction pattern, and the top electrode.

12. The method of claim 11, wherein
each of the first and second source gases includes a silicon-containing gas,
each of the first source gas, the first reaction gas, and the first purging gas does not include $NH_3$, and
the second reaction gas includes $NH_3$.

13. A method of fabricating a magnetic memory device, the method comprising:
forming a data storage structure on a substrate, wherein forming the data storage structure includes sequentially forming a bottom electrode, a magnetic tunnel junction pattern, and a top electrode on the substrate;
forming a first capping dielectric layer that conformally covers a lateral surface and a top surface of the data storage structure; and
forming a second capping dielectric layer on the first capping dielectric layer,
wherein each of the first and second capping dielectric layers includes silicon nitride,
wherein forming the first capping dielectric layer and forming the second capping dielectric layer are performed by different methods from each other,
wherein forming the first capping dielectric layer is performed under a temperature of about 275° C. to about 325° C.,
wherein forming the second capping dielectric layer is performed under a temperature of about 350° C. to about 400° C., and wherein
forming the first capping dielectric layer is performed based on a plasma-enhanced chemical vapor deposition process, and
forming the second capping dielectric layer is performed based on a physical vapor deposition (PVD) process or an ion beam deposition (IBD) process.

14. The method of claim 11, wherein forming the data storage structure forms a recession on an upper portion of a second interlayer dielectric layer, the recession being recessed toward the substrate on opposite sides of the magnetic tunnel junction pattern.

15. The method of claim 14, wherein
the first capping dielectric layer and the second capping dielectric layer are formed in the recession and have a lowermost surface located at a lower level than that of a bottom surface of the bottom electrode.

* * * * *